Nov. 29, 1960 R. M. MAURER 2,962,586

HIGH FREQUENCY MIXER STAGE

Filed Dec. 18, 1957

Inventor:
ROBERT M. MAURER

BY Eric D. Frankel
PATENT AGENT

United States Patent Office 2,962,586

Patented Nov. 29, 1960

2,962,586

HIGH FREQUENCY MIXER STAGE

Robert M. Maurer, Ulm (Danube), Germany, assignor to Telefunken G.m.b.H., Berlin, Germany Filed Dec. 18, 1957, Ser. No. 703,553

Claims priority, application Germany Dec. 19, 1956

3 Claims. (Cl. 250—20)

The present invention relates to a self-oscillating mixer stage employing a triode and adapted for use at high frequencies, particularly, for television (TV) bands in the range of decimeter-wave technique.

It has been known in the art to use self-oscillating mixer stages employing a triode in the circuits of heterodyne receivers for ultra high frequency oscillations. Such mixer stages have a low noise level and a high mixing amplification and are relatively simple and economical.

Furthermore, it has been known in the art to produce local oscillations by means of a three-point circuit (Colpitts circuit) used in such self-oscillating triode mixer stages. The three-point circuit seems to be necessary when the frequency range is extended to higher frequencies, particularly, if the frequency range covers the range of decimeter waves. Examples of such ranges include, in Germany, the frequency bands IV and V, wherein the band IV reaches from 470 to 585 mc. and the band V reaches from 610 to 940 mc.

If a three-point circuit is employed, the oscillator circuit has no additional capacitive load via the feedback coil. Such capacitive load would cause a decrease in the frequency stability, because of its tendency to vary.

In mixing circuits, it is generally desired to connect to ground one terminal of the receiver-tuned circuit and one terminal of the oscillator-tuned circuit. This last-mentioned requirement is fulfilled if the tuning is performed by a common multi-gang tuning capacitor. The mentioned requirement is also obtained if resonant line tank-circuits are employed, because the tank has to be connected to ground.

German Patent No. 739,095 discloses a mixer stage having a self-oscillating triode and a three-point circuit. In this device, both the receiver circuit and the oscillator circuit are connected to ground as required. However, this device has the receiver-circuit input connected between the grid and that of the terminals of the oscillator circuit which is to be connected to the grid. A circuit of this type does not yield optimum conditions for the generation of oscillations, even though optimum conditions for the generation of oscillations are the point of major concern in the field of high frequency mixers.

Optimum conditions for oscillations may be achieved with a device according to U.S. Patent No. 2,718,590, disclosing a mixing circuit having a self-oscillating triode connected in three-point circuit. In this device, the oscillator resonant circuit is connected directly between the anode and the grid. However, in this patent, the receiver circuit is grounded while the oscillator circuit is not grounded.

It is an object of the present invention to provide a self-oscillating mixer stage employing a triode in a three-point circuit for the oscillation, wherein are provided optimum conditions for oscillation of the self-oscillating mixer circuit, in which both the receiver circuit and the oscillator circuit are grounded.

It is another object of the invention to provide a circuit wherein the grid of the triode is grounded with respect to alternating currents of all the frequencies appearing in the receiver and oscillator circuits. Furthermore, the receiver circuit is connected between the triode cathode and ground, and the oscillator circuit is connected between the anode and the grid of the triode. In addition, the oscillator circuit is connected to ground and forms a part of the capacitive branch of the intermediate frequency circuit which I.F. circuit is connected to the anode of the triode.

Again, reference is made to the prior art. German Patent 914,397 discloses a self-oscillating triode mixer stage having the grid connected to ground by means of an A.C. conductor, which connection is made for all frequencies appearing in the receiver and the oscillator. In particular, said A.C. conductor comprises a capacitor and a resistor connected in parallel across the capacitor. However, the oscillations produced in the device according to this German patent are generated by means of a feedback coil, said coil being avoided in the device according to the invention. The feedback coil used in this German patent is connected in series with a resistor, said resistor having a value matching the input impedance of the triode. Both, the feedback coil and the resistor are connected to a conductor, which conductor is connected to the cathode. Thus, said resistor and said feedback coil are connected between ground and the cathode. The receiver circuit is connected between the neutral point on the feedback coil and ground for avoiding radiation of the oscillations. The oscillator resonant circuit is connetced in series with the I.F. resonant circuit and to the anode of the triode. This last-mentioned device has a feedback circuit which is entirely different from that used in the device according to the present invention.

In addition, it has been known to connect the input circuit between the cathode of a triode and ground, said triode being a part of a separately excited mixing stage. However, in this circuit, the grid is not effectively connected to ground for the entire receiving range, because a series-resonant-circuit is connected to the grid having its coil in the cathode lead of a separate oscillator tube. This resonant circuit is tuned to a frequency in the center of the receiver range. Consequently, this resonant circuit is only an effective short-circuit for the frequencies received within a narrow band. Input voltages having frequencies outside of said narrow band are weakened across the no-longer resonant circuit, because of the insufficient connection of the grid to ground. The final result is a deviation from optimum matching and a variation of the amplification factor.

It is another object of the invention to provide a circuit avoiding the need for neutralization for decoupling the receiver and the oscillator circuit. To prevent coupling of the local oscillations produced by the oscillator into the antenna, the single receiver-tuned circuit may be replaced by an input band-pass filter.

In some instances, the inductance of the lead to the cathode of the triode may cause some trouble if the invention is used in the range of decimeter waves, particularly, if the antenna has to be matched to the input circuit or to the input filter. In TV receivers, such matching is necessary to avoid reflections. The difficulty caused by the inductance of the cathode leads becomes apparent during step-down transformation of the input resistance of the triode. Thus, only the transformed resistance appears at the input circuit. This transformation is dependent upon frequency and, thus, renders the effective resonant impedance strongly dependent upon frequency. In view of this fact, it becomes apparent that the matching of the antenna is no longer independent of frequency. Furthermore, the dependence upon frequency of the effective resonant impedance implies a corresponding dependence upon frequency of both amplification and band width. Moreover, the input circuit is out of tune to an extent which also depends upon frequency.

It is a further object of the invention to avoid the above difficulty by connecting a capacity between the cathode and the receiver-tuned circuit, which capacity is adjusted to effect series-resonance with the inductance of the cathode lead. The resonant frequency is set at a point in the center of the receiving frequency range. This series-resonant circuit is strongly damped because of the low input resistance of the grounded grid circuit, i.e., the reciprocal of the slope of the triode characteristic. This strong damping effects the cancellation of the cathode inductance over a wide range of frequencies.

Still further objects and the entire scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

Figure 1:
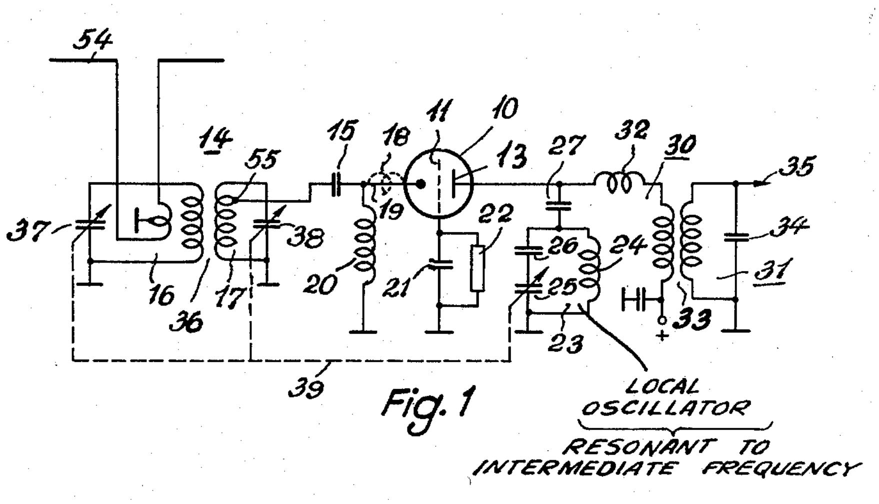
Figure 1 shows diagrammatically an embodiment of the invention.

The self-oscillating mixer triode is indicated by numeral 10, the triode having a grid 11, a cathode 12, and an anode 13. By means of the tap 55, the input band-pass filter 14 is connected to the cathode 12 through the capacitor 15 and the lead 19. The input band-pass filter comprises two receiver resonant circuits 16 and 17, inductively coupled by a transformer 36. In addition the resonant circuits comprise tunable capacitors 37 and 38, respectively. An antenna 54 is inductively coupled to transformer 14. A coil 18, illustrated in dashed lines, indicates the self-inductance of the lead 19. As mentioned above, the value of the capacitor 15 is chosen that it will just cancel the value of the inductance 18. The cathode current flows from the cathode to ground via a choke 20. The mixer tube 10 operates with a grounded grid for all frequencies received, because the grid is effectively connected to ground via the capacitor 21 which represents a direct short circuit for the high frequencies involved. A grid leak resistor 22 is connected in parallel with the capacitor 21. The oscillator circuit 23 comprises a coil 24, a variable capacitor 25 and a fixed capacitor 26, and another capacitor 27. Capacitors 25, 37 and 38 are varied by a common control means, schematically indicated by dashed line 39. The tuned circuit 23 is connected between the grid and the anode through capacitor 27. The capacitive-voltage divider of the three-point circuit includes the internal capacities of the tube 10. Hence, some point located between the ends of the oscillator circuit 23 has the same R.F. potential as the cathode.

The novel feature of this invention, therefore, resides in that the end of the oscillator-tuned circuit which is connected to the grid is also connected to ground. Numeral 30 indicates an I.F.-tuned circuit coupled with another tuned circuit 31, serving as a band-pass filter. The I.F. circuit 30 comprises an ultra high-frequency choke 32, the capacitor 27 and the inductance of the transformer 33 which is resonant with capacitor 27. The choke 32 blocks the receiver frequencies and the local oscillations of the mixer circuit 23 from entering the I.F. circuit. The tuned circuit 31 includes also a transformer 33 and a capacitor 34. The I.F. output, for example 36 mc., appears at a terminal 35.

Figure 2:
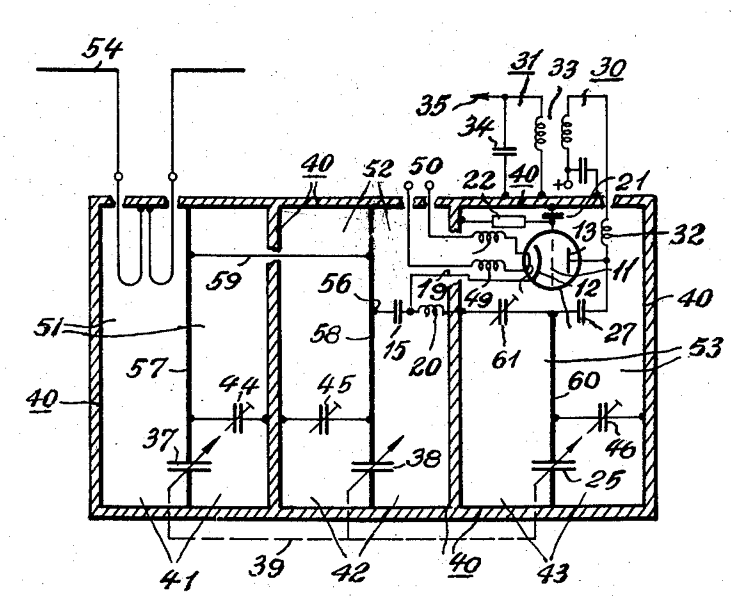
Figure 2 shows substantially the same circuit as disclosed in Figure 1, but resonant line tank circuits are used therein.

In general, the circuit of Figure 2 corresponds with the circuit shown in Figure 1, and the same reference characters are used for corresponding parts. However, the tuned circuits 16, 17 and 23, shown schematically in Figure 1, assume the form of resonant tanks in Figure 2 in a known manner, see Radio Mentor, 1956, pages 20 to 24. These tanks are indicated by numerals 41, 42 and 43, respectively. Thus, the tanks 41 and 42 comprise the input band-pass filter for the structure disclosed in Figure 2, and the tank 43 is the oscillator-tuned circuit. A common chassis 40 has three chambers 51, 52 ,53 and is at ground potential. Each one of the resonant tanks includes a small adjustable disk capacitor 44, 45, 46, respectively. Coupling inductances 57, 58 and 59 correspond to the inductive coupling at 36 in Figure 1. Inductance 60 in Figure 2 corresponds with the coil 24 in Figure 1. Adjustable capacitor 61 is a component of the oscillator circuit comprising also the components 25, 27, 60. This oscillator circuit is generally indicated by the numeral 43. Tube 10 in Figure 2 is shown as positioned within the tank chamber 53. However, only the socket is actually positioned within the tank and the tube itself is inserted into the socket from the outside.

Filament 47 is connected through chokes 48 and 49 to a proper source 50 for heating the cathode 12. The tap 56 corresponds to tap 55 in Figure 1.

The circuits as described above may be connected to the tuner of a TV receiver. The first stage of the TV receiver would thus be used as an I.F. stage. The present mixer may then be used as a first amplifier and converter stage for other TV bands than those for which the equipment was designed, wherein the channel selector of the TV receiver becomes an I.F. circuit connected to the output of the present novel converter.

I claim:

1. In a self-oscillating mixer stage for a receiver having an input, the combination which comprises: a conductive chassis having walls defining at least two chambers sharing a common wall, said chassis constituting the ground for said stage while the same operates in the range of U.H.F.; a tube having a cathode, a grid and an anode; first means forming a resonant line tank circuit, said first means including one of said chambers, a first inner conductor arranged in said one chamber and coupled to ground and to said anode; second means forming a R.F.-tuned tank circuit, said second means including the other of said chambers and a second inner conductor arranged in said other chamber, said second inner conductor being coupled to the receiver input, to ground and to said cathode of said tube; A.C. conductive circuit means connecting said grid to ground at all frequencies within said U.H.F. range, thus placing said resonant line tank circuit in three-point connection with the anode-cathode capacitance and the grid-cathode capacitance of said tube; and an I.F.-tuned circuit having an inductive branch and a capacitative branch, said resonant line tank circuit forming a part of said capacitative branch of said I.F.-tuned circuit, whereby the generation of oscillations as well as the mixing of these oscillations with the received oscillations are effected with the aid of a single tube while allowing said tank circuits to be formed in two chambers sharing a common wall.

2. The combination defined in claim 1 wherein said first inner conductor of said first means is a first variable capacitor for tuning said resonant line tank circuit, and wherein said second inner conductor of said second means is coupled to ground by way of a second variable capacitor for tuning said R.F.-tuned tank circuit.

3. The combination defined in claim 2, wherein said first and second variable capacitors are ganged for unitary tuning of said tank circuits.

References Cited in the file of this patent

UNITED STATES PATENTS

| | | |
|---|---|---|
| 2,107,393 | Schlesinger | Feb. 8, 1938 |
| 2,277,638 | George | Mar. 24, 1942 |
| 2,444,854 | Schlesinger | July 6, 1948 |
| 2,603,723 | Thompson | July 15, 1952 |
| 2,804,544 | Lannan | Aug. 27, 1957 |
| 2,819,391 | Reiches | Jan. 7, 1958 |